(12) United States Patent
Nakamura

(10) Patent No.: US 7,082,030 B2
(45) Date of Patent: Jul. 25, 2006

(54) CONTROL BOX

(75) Inventor: Hiroyoshi Nakamura, Toyohashi (JP)

(73) Assignee: Toyoda Koki Kabushiki Kaisha, Kariya (JP)

( * ) Notice: Subject to any disclaimer, the term of this patent is extended or adjusted under 35 U.S.C. 154(b) by 234 days.

(21) Appl. No.: 10/765,157

(22) Filed: Jan. 28, 2004

(65) Prior Publication Data

US 2004/0184235 A1    Sep. 23, 2004

(30) Foreign Application Priority Data

Feb. 28, 2003    (JP) ............................ 2003-053131

(51) Int. Cl.
*H05K 7/20*    (2006.01)

(52) U.S. Cl. .............. 361/695; 361/697; 174/16.1; 174/16.3; 165/80; 165/3; 165/122; 454/184

(58) Field of Classification Search ............... 361/687, 361/690, 694, 695, 704, 716, 721; 174/16.1, 174/16.3; 165/80.3, 104.33, 122; 454/184
See application file for complete search history.

(56) References Cited

U.S. PATENT DOCUMENTS

| | | | | |
|---|---|---|---|---|
| 6,005,770 A | * | 12/1999 | Schmitt | 361/695 |
| 6,104,602 A | * | 8/2000 | Morris et al. | 361/678 |
| 6,115,250 A | * | 9/2000 | Schmitt | 361/695 |
| 6,288,897 B1 | * | 9/2001 | Fritschle et al. | 361/687 |
| 6,480,381 B1 | * | 11/2002 | Negishi | 361/695 |
| 6,504,718 B1 | * | 1/2003 | Wu | 361/695 |
| 6,525,935 B1 | * | 2/2003 | Casebolt | 361/687 |

\* cited by examiner

*Primary Examiner*—Boris Chervinsky
(74) *Attorney, Agent, or Firm*—Oblon, Spivak, McClelland, Maier & Neustadt, P.C.

(57) ABSTRACT

A control box 10 according to the present invention has at least one electric device 12 and fan unit 17 inside a case 11. In the case 11, a dividing board 15 divides a room into two rooms which include a heated room 30, close to the electric device 12, and a ventilated room 31. First and second openings 24B,24A open the heated and Ventilated rooms 30,31 to the outside of the case 11, respectively. The fan unit 17 is disposed on a window penetrating the dividing board 15 and feeds air from one of two rooms to another.

17 Claims, 9 Drawing Sheets

CONTROL BOX

INCORPORATION BY REFERENCE

The present application claims priority under 35 U.S.C. §119 to Japanese Patent Application No. 2003-053131, filed on Feb. 28, 2003. The content of that application is incorporated herein by reference in their entirety.

BACKGROUND OF THE INVENTION

1. Field of the Invention

The present invention relates to a control box having at least one electric device which is cooled down by at least one fan unit.

2. Description of the Related Art

A control box is equipped with one or more fan units for cooling down heated electric devices which are put therein. For durability of the fan units, they must be replaced or maintained, regularly or when one of them breaks down. Generally, the control box comprises a case with a door in the front portion so as to assemble/disassemble the electric devices and be operated therefrom. The fan units are located in back of the electric devices so that an operator can replace the fan units with new ones from the rear portion of the case. The rear portion of the case, however, may cling to a machine or a wall of the factory, whereby the control box must be moved in order to replace the fan units.

Japanese Patent Laid-open Publication No. 2000-340975, the prior art to resolve the above-mentioned problem, discloses a fan unit connecting the fan with one portion of the board via link mechanism. With the link mechanism, when the fan unit is inserted into the case from its front, the fan is turned to the back of the electric devices. However in the prior art, since the path of the fresh air is not separated from the path of the heated air in the case, the heated air through the electric devices, for example, may enter an intake of the fans so as to cool down inefficiently. For cooling down efficiently, since it is necessary to locate the fans in back of a plurality of the electric devices, a plurality of the fan units should be inserted into the box. Further, it is necessary to make enough spaces for turning and placing the fans. Furthermore, the link mechanisms for turning the fans are complicated so that manufacturing the fan units needs a lot of process.

SUMMARY OF THE INVENTION

In view of the previously mentioned circumstances, it is an object of the present invention to provide a control box, in which an electric device/devices can be cooled down efficiently and space for installing a fan unit/units can be smaller.

It is another object of the present invention to provide a control box in which fan can be replaced easily.

In order to achieve the above and other objects, the present invention provides a control box having at least one electric device and fan unit inside the case. In the case, a dividing board, opposite to one portion of the case, divides a room between the one face and the electric device into two rooms which include a heated room, close to the electric device, and a ventilated room. First and second openings open the heated and ventilated rooms to the outside of the case, respectively. The fan unit is disposed on a window penetrating the dividing board and feeds air from one of two rooms to another.

According to such control box divided into the heated and ventilated rooms in its inside, air is made to flow in one direction between the both rooms by the fan unit. Therefore, the control box sucks fresh air into one of the both rooms and exhausts air, absorbing heat of the electric device, from another room, from/to the outside through the openings respectively. With the dividing board, the paths of air, before and after absorbing heat of the electric device, are divided, and thus air after absorbing heat can be efficiently exhausted to the outside of the case so as to cool down the inside efficiently.

BRIEF DESCRIPTION OF THE DRAWINGS

Various other objects, features and many of the attendant advantages of the present invention will be readily appreciated as the same becomes better understood by reference to the following detailed description of the preferred embodiments when considered in connection with the accompanying drawings, in which.

DETAILED DESCRIPTION OF THE PREFERRED EMBODIMENTS

First Embodiment

Figure 1:
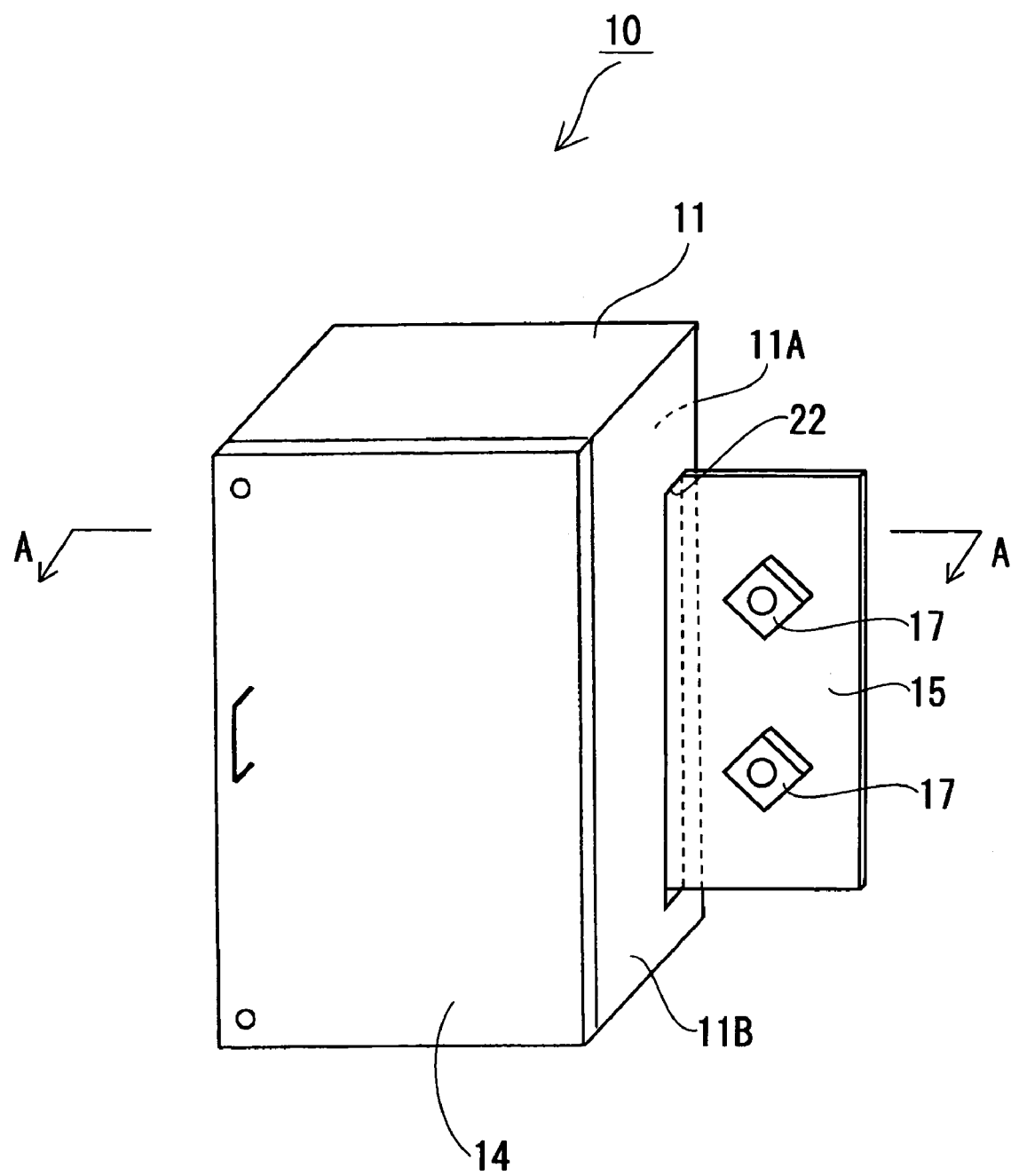
FIG. 1 is an oblique perspective view of the front of a control box according to first embodiment of the present invention.

A preferred embodiment of first example of a control box according to the present invention will be described referring to FIGS. 1 to 4. FIG. 1 shows a whole oblique perspective view of the control box 10 of the first embodiment. The control box 10 comprises a rectangular parallelepiped case 11 in which a plurality of electric devices 12 (see FIG. 2) are installed. The case 11, made from steel, has a door 14 in its front surface portion besides five surface portions. When the door 14 is opened, the electric devices 12 are faced to.

The electric devices 12 consist of elements, for example a power unit, a servo amplifier and/or etc. Facing on the front door 14, there are disposed some of the elements of the electric devices 12, for example a terminal block, a display, a control panel and/or etc., of which rears form heat radiation fins 13 (see FIG. 2).

Figure 3:
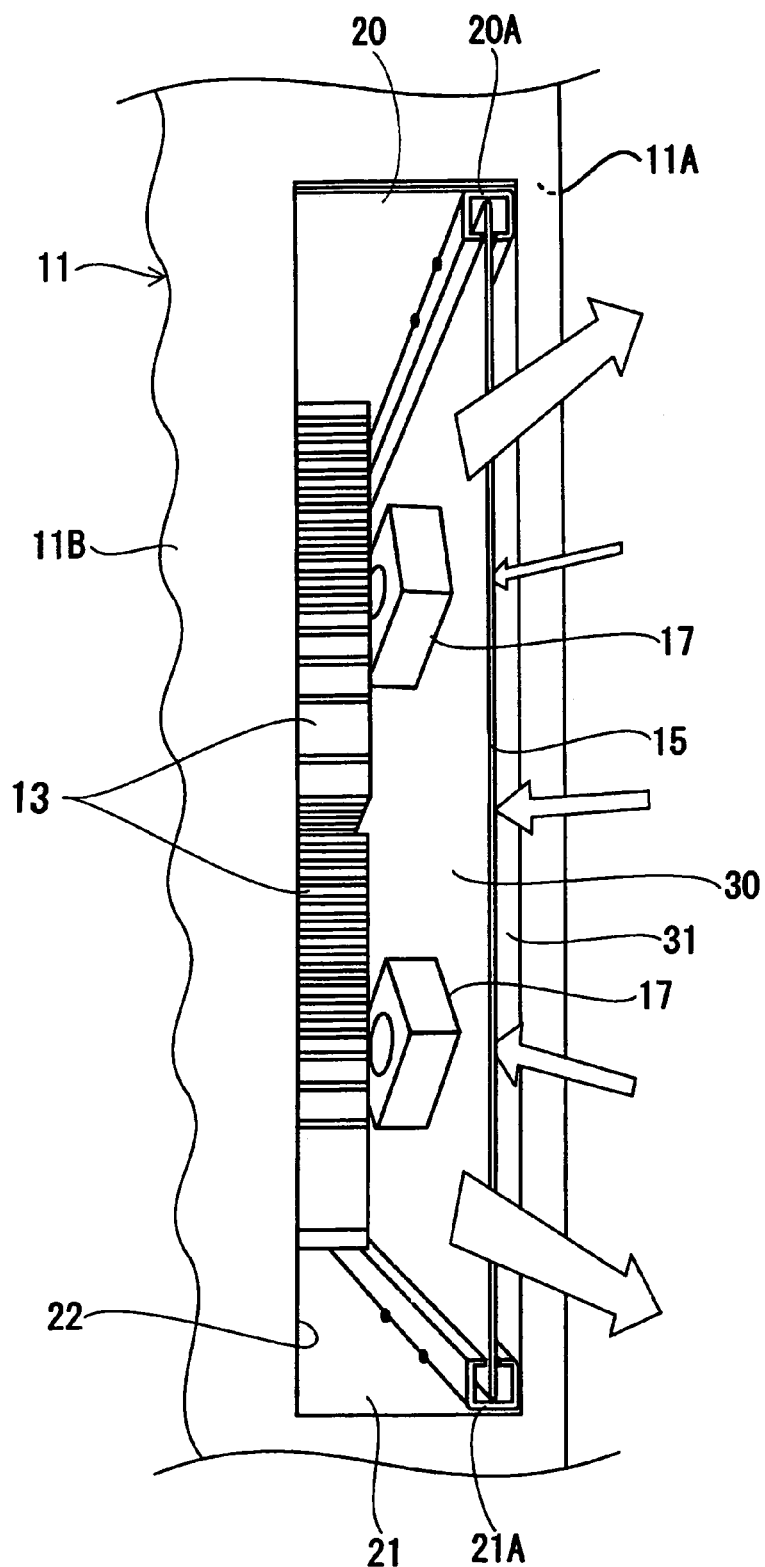
FIG. 3 is an oblique perspective view of a dividing board inserted into a slot of the control box.

As shown in FIG. 3, with opposing to each other in the case 11, upper and lower plates 20 and 21 are respectively disposed above and below the rear of the electric devices 12. A dividing board 15, according to the present invention, is put into the both plates 20,21 and faces to the rear portion 11A of the case 11. Such arrangement divides the room, between the rear portion 11A and radiation fins 13, into a heated-room 30 and a ventilated room 31. The heated room 30 is close to the electric devices 12 and the ventilated room 31 is close to the rear portion 11A.

Figure 4:
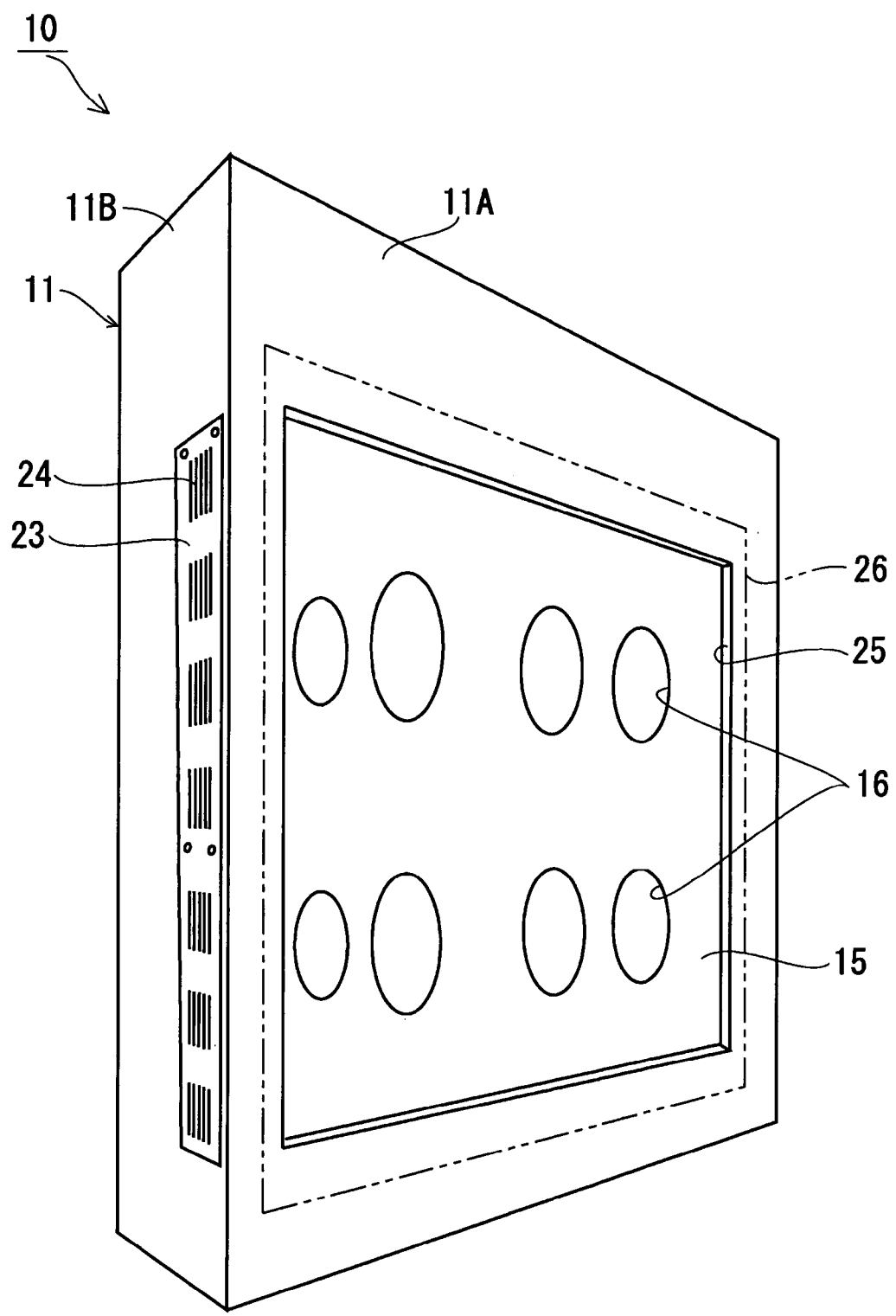
FIG. 4 is an oblique perspective view of the rear of the control box.

Specifically, the dividing board 15, for example made from a steel plate, provides a plurality of ventilation windows 16 penetrating therethrough. A plurality of thin rectangular parallelepiped fan units 17 are arranged over the windows 16. Each fan unit 17 is centered over each ventilation window 16 of the board 15 and fixed by screws thereon. One of the side portions 11B of the case 11 provides an opening of a board-insert slot 22 which opens the room between the both plates 20,21 to the outside. The upper and lower plates 20 and 21 respectively have raillike insert guides 20A and 21A, welded thereon and extending to the length substantially same to that of the depth, next to the rear portion 11A. The dividing board 15, on which fan units 17 face to heat radiation fins 13 of the electric devices 12, is inserted from the slot 22 along the guides 20A, 21A. In addition, the board-insert slot 22 also serves the function of an opening to the outside according to the present invention.

Where the dividing board 15 is inserted into the depth end of the case 11, the board 15 places with a little gap from the one side portion of the case 11 and touches on the other side portion of the case 11. Such arrangement regulates air flow between the heated room 30 and the ventilation room 31. After inserting the board 15, the slot 22 is closed by a side cap 23. As shown in FIG. 4, the side cap 23 provides plural sets of a plurality of slits 24. In each set 24, each of vertical slits is aligned in the front/back direction. And each set of the slits 24 is spaced out evenly in the vertical direction. The rear portion 11A of the case 11 provides a maintenance window 25 which is usually covered by a back plate 26 screwed thereon.

Next, the operation and the effect of the first embodiment will be described. For example, the control box 10 is used for a machine tool or a robot and is disposed along an automotive product line or so. While the control box 10 is turned on, electric power is supplied to the electric devices 12 and the fan units 17 so as to heat up the electric devices 12. When the machine tool or etc. is further driven, the electric devices 12 increasingly heat up the heated room 30.

Figure 2:
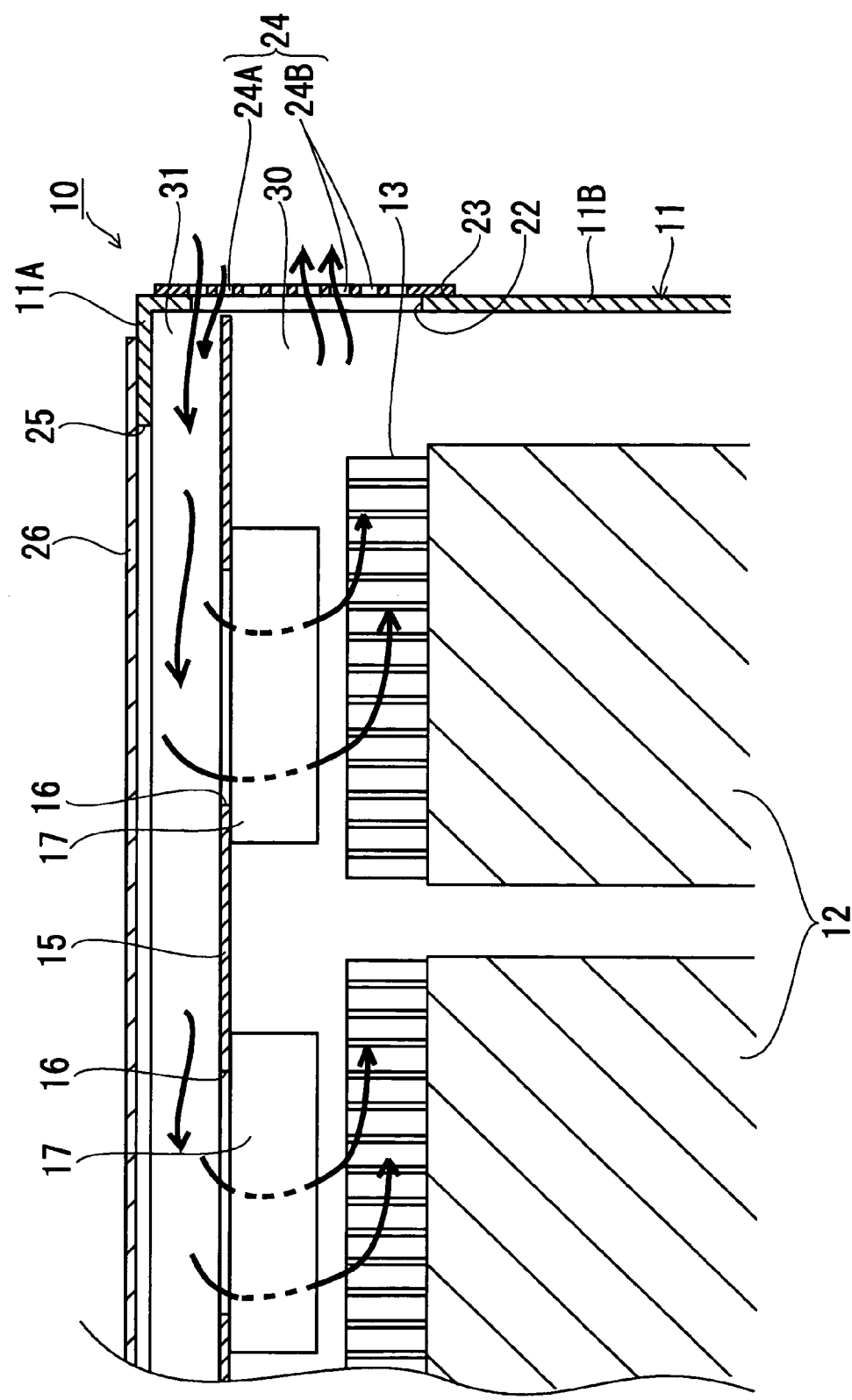
FIG. 2 is a section view of A—A in FIG. 1.

While the control box 10 is turned on, the fan units 17 are also driven so as to forcibly flow air from the ventilated room 31 to the heated room 30. Therefore, as shown in FIG. 2, fresh air is sucked into the ventilated room 31 via the opening portion of the board-insert slot 22 behind the dividing board 15, more specifically slits 24A of the sets of slits 24 of the side cap 23 behind the dividing board 15 (equivalent to "second opening" of the present invention). And the fan units 17 blow air into the heat radiation fins 13 of the electric devices 12 through the windows 16 of the dividing board 15. Air absorbs heat of the electric devices 12 and is exhausted to the outside of the case 11 via the opening portion of the board-insert slot 22 ahead of the dividing board 15, more specifically slits 24B of the sets of slits 24 of the side cap 23 ahead of the dividing board 15 (equivalent to "first opening" of the present invention).

As described above, according to the control box 10 of the first embodiment, since the room inside the case 11 is divided into the heated and ventilated rooms 30 and 31, the paths of air, before and after absorbing heat of the electric devices 12, are divided. Therefore, heated air can be efficiently exhausted to the outside of the case 11 so as to efficiently cool down its inside. The exhausted air is blown to the outside of the case 11 with some force through the slits 24B so that the air rarely returns therein through the slits 24A.

In the case of the maintenance of the fan units 17, the divided board 15 can be pulled out through the board-insert slot 22 after taking the side cap 23 away from the case 11. Therefore, if the rear portion 11A faces to the machine, a wall of a factory or etc., the fan units 17 can be easily take apart without taking the electric devices 12 apart. The board-insert slot 22 is also used as the opening for the intake and exhaust, so as to simplify the construction.

Further, according to the first embodiment, since the number of the fan units 17 and windows 16 of the dividing board 15 is plural, each fan unit 17 can be compact and thin so that the space for the dividing board 15 can be compact.

Second Embodiment

Figure 5:
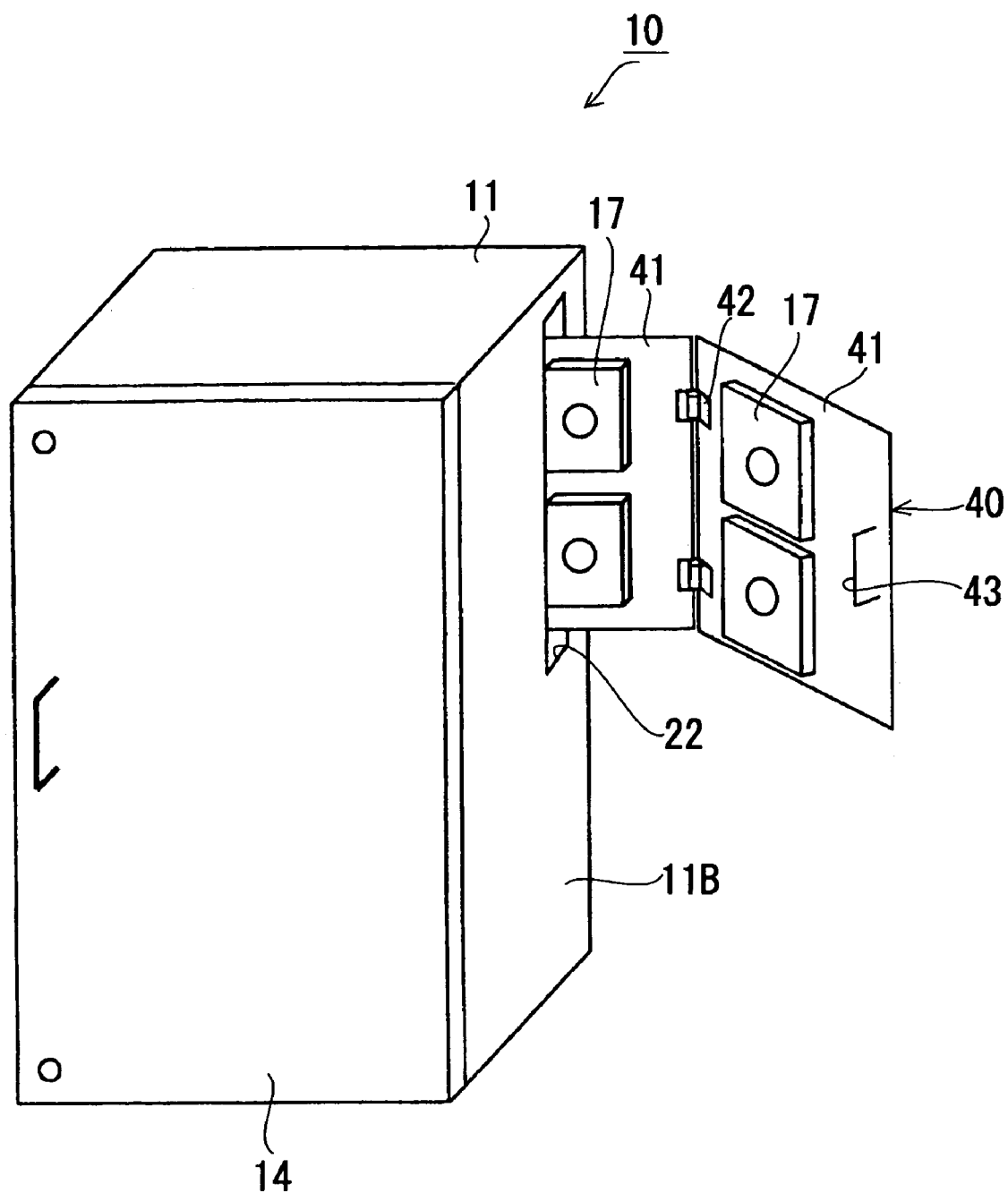
FIG. 5 is an oblique perspective view of the front of a control box according to second embodiment of the present invention.

Second embodiment of the present invention will be described with referring to FIG. 5. The second embodiment differs in the construction of the dividing board from the first embodiment, whereby the difference from the first embodiment will only described and the correspondence will be omitted with numbering the same.

A dividing board 40 is constructed by a pair of boards 41 which are pivotably connected each other. Specifically, the boards 41 align in direction of insert into the slot 22, and are connected by hinges 42 to be able to pivot each other around the vertical axis. A plurality of fan units 17 are installed in each board 41. And, a handle 43 is fixed on the end of one of the boards 41.

According to the dividing board 40 of the second embodiment, in the case of pulling out the dividing board 40 from the case 11, the boards 41 can be folded up by the hinges 42 after one board 41 is pulled out, and the other board 41 is pulled out. Therefore, the space, for pulling out the dividing board 40 from the case 11, can be smaller so as to be able to arrange the control box 10 close to another control box, the wall of the factory or etc.

Third Embodiment

Figure 6:
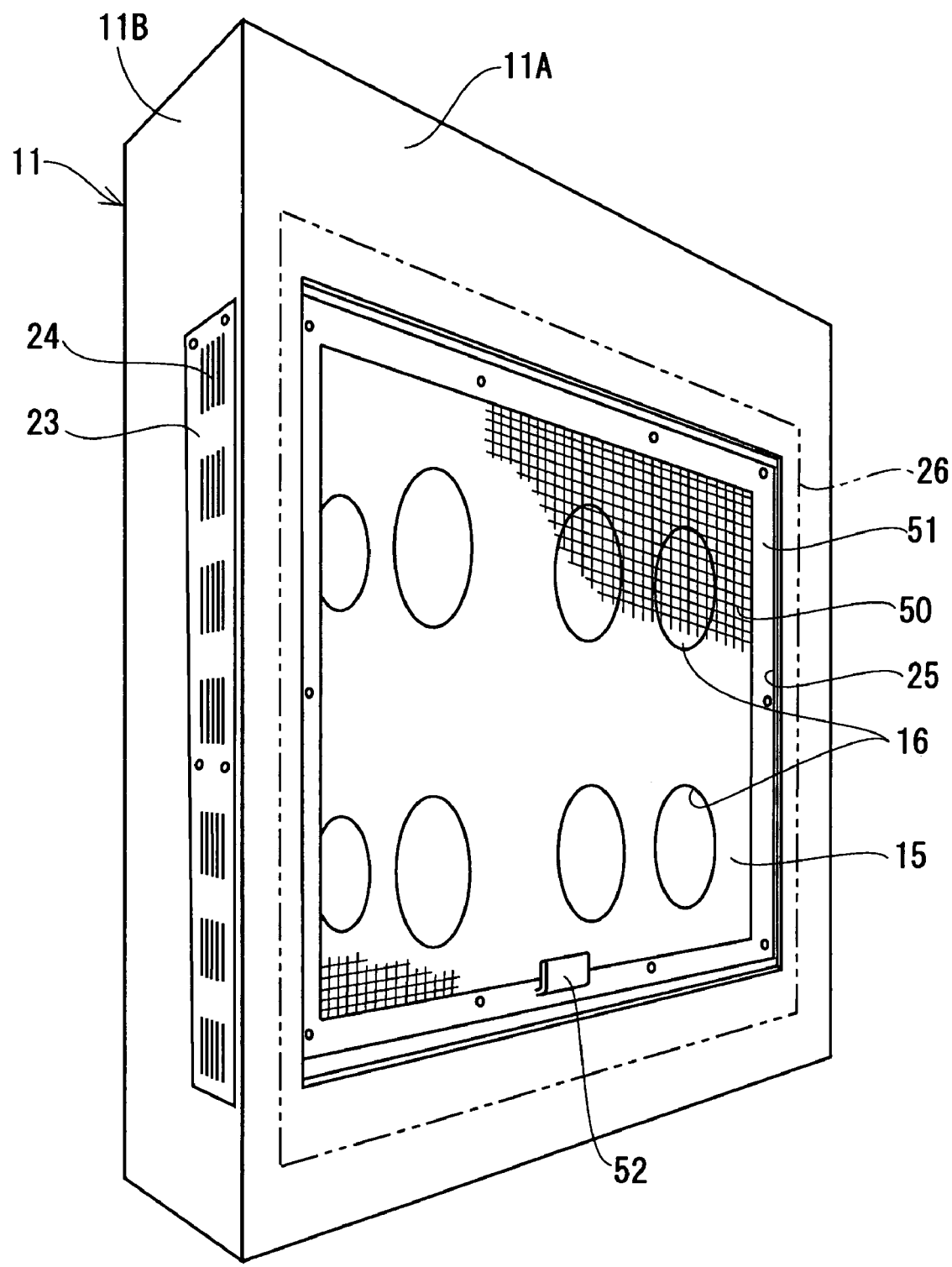
FIG. 6 is an oblique perspective view of the rear of a control box according to third embodiment of the present invention.

Third embodiment of the present invention will be described with referring to FIG. 6. In the third embodiment, the dividing board 15 includes a mesh 50, corresponding to "filter" of the present invention, on the face close to the ventilation room 31. Hereinafter, the difference from the first embodiment will only described and the correspondence will be omitted with numbering the same.

The mesh 50 is put up in a frame 51 screwed on the dividing board 15 so as to cover the windows 16. A hook 52, formed on the bottom of the frame 51, projects to the back plate 26 and curves upward. The hook 52 makes a space between the back plate 26 and the mesh 50. Therefore, the mesh 50 filters the dust or mist in air of the outside so as to prevent the dust or mist from invading to the electric devices 12.

Forth Embodiment

Figure 7:
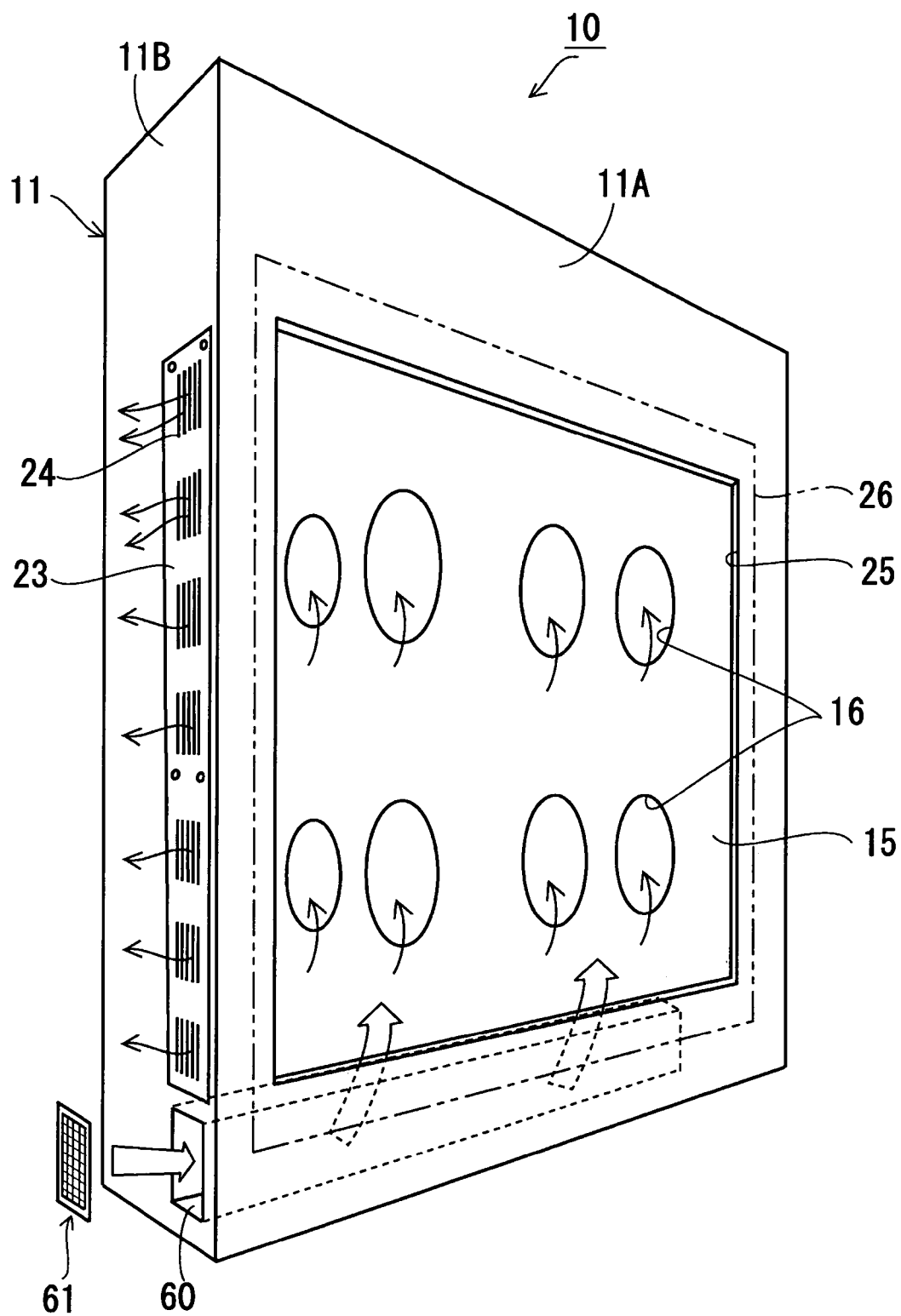
FIG. 7 is an oblique perspective view of the rear of a control box according to third embodiment of the present invention.

Forth embodiment of the present invention will be described with referring to FIG. 7. In the forth embodiment, the control box 10 includes an intake duct 60. Hereinafter, the difference from the first embodiment will only described and the correspondence will be omitted with numbering the same.

The duct 60 is disposed below the lower plate 21 (shown in FIG. 3) and exists in the direction of insert of the dividing board 15. One end of the duct 60 opens to the board-insert slot 22 and is covered by a mesh 61 corresponding to "filter" of the present invention. The duct 60 connects with the ventilated room 31 in its longitudinal direction. Air of the outside is sucked into the duct 60 via mesh 61, upwardly into the ventilated room 31, and then into the heated room 30. The forth embodiment occurs the function and effect as same as the first and third embodiments, and reliably separates exhaust from intake.

Fifth Embodiment

Fifth embodiment of the present invention will be described with referring to FIGS. 8 and 9. In the fifth embodiment, the heated room 30 of the first embodiment is separated into a device-storage room 32, for storing the electric devices 12, and a radiation room 33 by a radiation board 18 arranged in the heated room 30 and facing to the dividing board 15. The device-storage room 32 is substantial tightly sealed. The radiation room 33 opens to the outside of the case via the slit 24B corresponding to "first opening" of the present invention. Hereinafter, the difference from the first embodiment will only described and the correspondence will be omitted with numbering the same.

Figure 8:
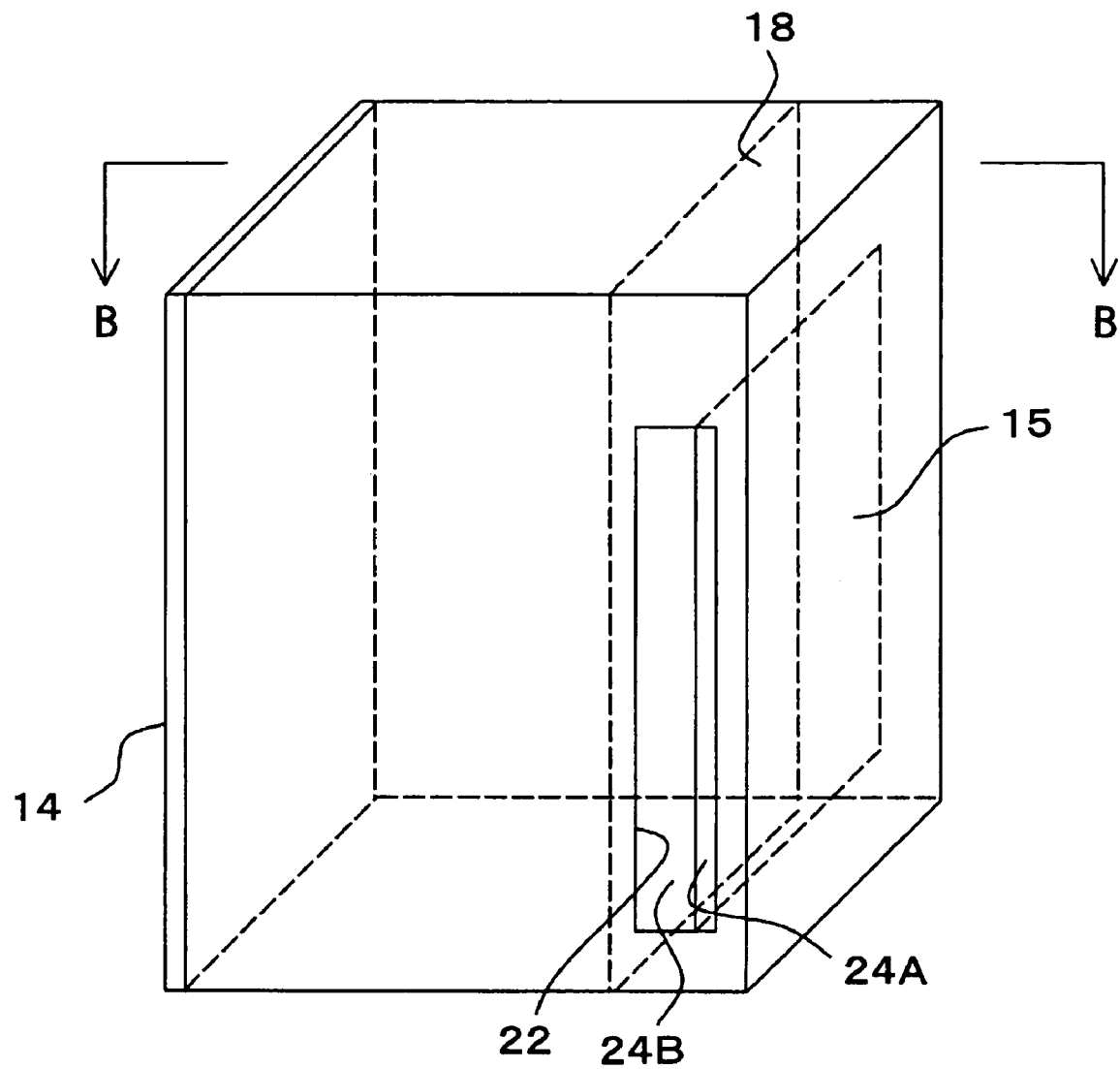
FIG. 8 is an oblique perspective view of the side of a control box according to fifth embodiment of the present invention.
Figure 9:
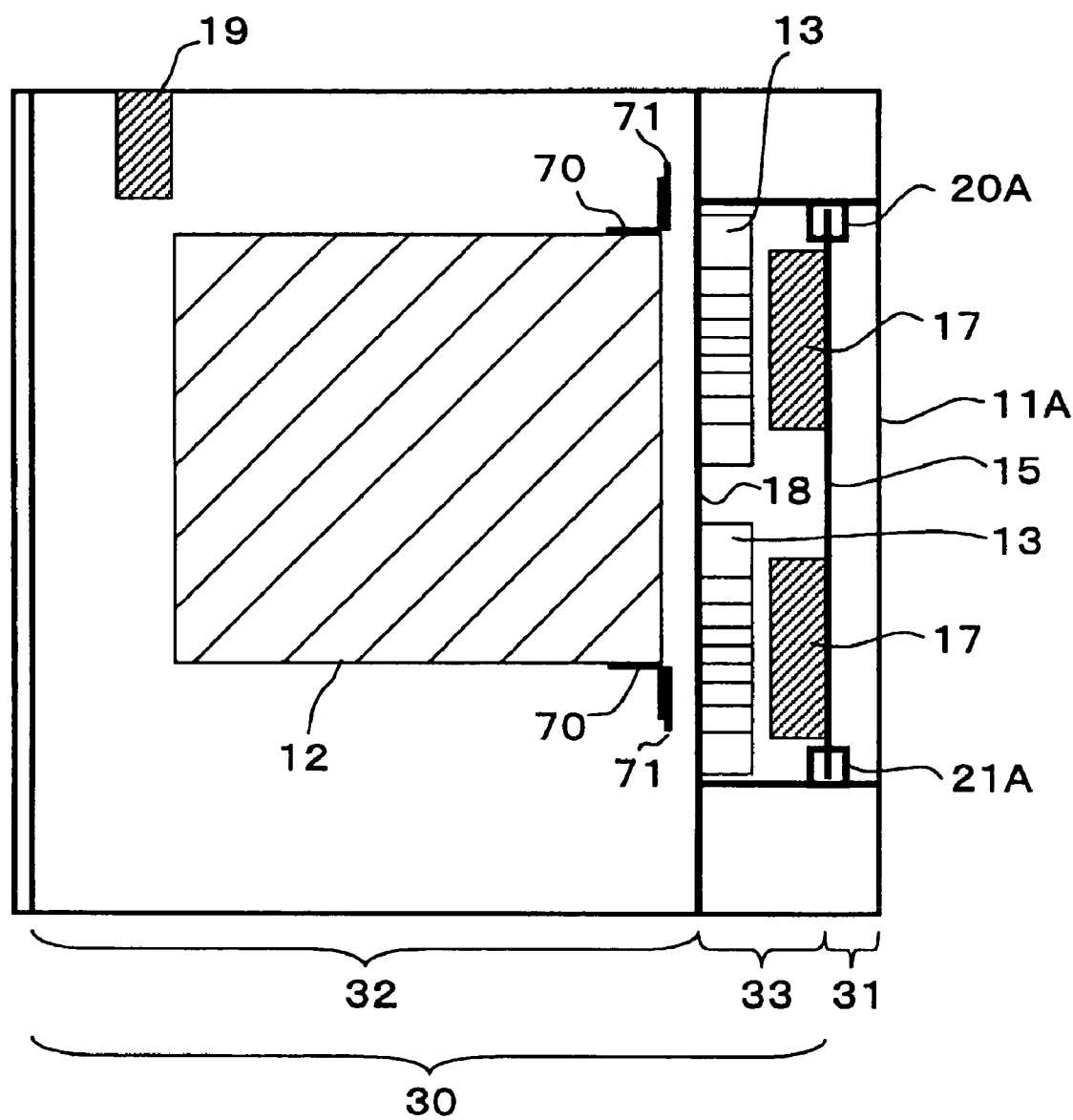
FIG. 9 is a section view of B—B in FIG. 8.

FIG. 8 is an oblique perspective view according to the fifth embodiment and FIG. 9 is a section view of B-B in FIG. 8. As shown in FIGS. 8 and 9, the inside of the case 11 is divided the heated and ventilated rooms 30 and 31. The heated room 30 is further divided the device-storage room 32 for storing the electric devices 12 and the radiation room 33 by the heat radiation board 18. The device-storage room 32 is substantially sealed up, and the heat radiation room 33 opens to the outside of the case 11 via slits 24B. The heat radiation fins 13 are arranged on the heat radiation board 18 facing to the fan units 17 in the heat radiation room 33.

The electric devices 12 in the device-storage room 32 are fixed on rails 70, bridging between the both side portions of the case 11, by L-shape metal fittings 71. The heat of the electric devices 12 is conducted to the heat radiation board 18 and the heat radiation fins 13, and then cooled down by the fan units 17. For further efficiency of cooling down, a sub-fan unit 19 can be added in the device-storage room 32 in order to circulate air therein forcibly.

According to the fifth embodiment, since the device-storage room 32 storing the electric devices 12 is substantially sealed up, the electric devices 12 can prevent the dust and/or mist from sticking and invading thereto.

Another Embodiment

The present invention is not limited to the above-mentioned embodiments, and covers embodiments not to deviate from the feature of the invention, like mentioned below.

(1) The fan units 17, according to the first to forth embodiments, transfer air from the ventilated room 31 to the heated room 30, and vice versa.

(2) Although the board-insert slot 22, according to the first to forth embodiments, serves the function of a ventilation opening, they can be separated.

(3) Although the opening for intake and exhaust (board-insert slot 22), according to the first embodiment, is formed in the side portion 11B of the case 11, the opening for intake and exhaust can be formed in top or rear portion of the case 11.

(4) Although the dividing board 15, according to the second embodiment, includes two boards connected by hinges, the boards can be separated. Or the boards can be connected by the other elements, for example rings.

(5) The dividing board 15, according to the first to forth embodiments, is inserted/pulled out from the board-insert slot 22 in the right side portion 11B of the case 11, and vice versa. Or the slot 22 can be formed in each side portion. In the case of forming the slots 22 in the both side portions, the operator can select the slot 22 for easy maintenance in accordance with the situation so as to be efficient.

(6) According to the first to forth embodiments, although intake and exhaust are performed from the board-insert slot 22, a penetrating window, facing to the heated and ventilated rooms 30 and 31, can be formed on which the end of the dividing board 15 touches.

What is claimed is:

1. A control box comprising:
   a case;
   at least one heat generating electric device located in the case;
   a dividing board having at least one window extending therethrough and further including a fan unit covering said window;
   a slot in a wall of said case;
   at least one dividing board guide in said case,
   wherein said slot and said dividing board guide are positioned at said case, and said dividing board is dimensioned, such that said dividing board introduced into said case via said slot may be guided by said dividing board guide to be inserted in said case such that said dividing board substantially completely separates the interior of said case into a heated room having said electric device and a ventilated room which does not have said electric device or any other electric device;
   first and second openings for opening said heated and ventilated rooms to the outside of said case, respectively
   wherein said fan unit is adapted to feed air from one of said rooms to another.

2. A control box according to claim 1:
   wherein said fan unit feeds air from said ventilated room to said heated room.

3. A control box according to claim 2 comprising:
   a filter disposed between said second opening or said window in order to filter out dust/mist in air.

4. A control box according to claim 1:
   wherein said electric device has radiation fins in the region opposite to said fan unit.

5. A control box according to any one of claims 1 to 4 comprising:
   a door disposed on said front portion of said case;
   wherein the rear portion of said case faces to said dividing board and the side portion of said case forms said openings.

6. A control box including at least one electric device and fan unit in a case, said control box comprising:
   a dividing board for dividing said control box into two rooms which include a heated room and a ventilated room in said case;
   first and second openings for opening said heated and ventilated rooms to the outside of said case, respectively;
   wherein said fan unit is disposed on a window penetrating said dividing board and feeds air from one of said rooms to another; and a radiation board for separating said heated room into a device installing room, installing said electric device, and a radiation room, opened to the outside via the first opening;

wherein said radiation board has said radiation fins on the side facing to said radiation room.

7. A control box according to claim 6 comprising:

a door disposed on said front portion of said case;

wherein the rear portion of said case faces to said dividing board and the side portion of said case forms said openings.

8. A control box according to claim 6 wherein the end of said dividing board reaches said slot.

9. A control box according to claim 8:

wherein said slot is arranged to be a ventilation opening.

10. A control box according to claim 8 comprising:

at least one guide for guiding said dividing board;

wherein said guide extends from said slot to the end of said case.

11. A control box according to claim 8:

wherein said dividing board comprises a plurality of boards, each having one of said fan units; and wherein said boards are arranged to be sequentially inserted into said guide.

12. A control box according to claim 11:

wherein said boards are pivotably connected each other.

13. A control box including at least one electric device and fan unit in a case, said control box comprising:

a dividing board for dividing said control box into two rooms which include a heated room and a ventilated room in said case; and first and second openings for opening said heated and ventilated rooms to the outside of said case, respectively;

wherein said fan unit is disposed on a window penetrating said dividing board and feeds air from one of said rooms to another, wherein another face of said case forms an opening divided into said first and second openings by said dividing board put thereon.

14. A control box including at least one electric device and fan unit in a case, said control box comprising:

a dividing board for dividing said control box into two rooms which include a heated room and a ventilated room in said case;

first and second openings for opening said heated and ventilated rooms to the outside of said case, respectively;

wherein said fan unit is disposed on a window penetrating said dividing board and feeds air from one of said rooms to another; and a slot formed in the side portion of said case in order to insert/pull out said dividing board, wherein said slot is arranged to be a ventilation opening;

wherein the end of said dividing board touches on said slot.

15. A control box according to claim 14 comprising:

at least one guide for guiding said dividing board;

wherein said guide extends from said slot to the end of said case.

16. A control box according to claim 14:

wherein said dividing board comprises a plurality of boards, each having one of said fan units; and wherein said boards are arranged to be sequentially inserted into said guide.

17. A control box according to claim 16:

wherein said boards are pivotably connected each other.

* * * * *